(12) United States Patent
Sharma et al.

(10) Patent No.: US 6,808,940 B2
(45) Date of Patent: Oct. 26, 2004

(54) MAGNETIC SHIELDING FOR REDUCING MAGNETIC INTERFERENCE

(75) Inventors: Manish Sharma, Mountain View, CA (US); Manoj Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 108 days.

(21) Appl. No.: 10/232,209

(22) Filed: Aug. 30, 2002

(65) Prior Publication Data
US 2004/0043516 A1 Mar. 4, 2004

(51) Int. Cl.[7] .............................................. H01L 21/00
(52) U.S. Cl. .............................. 438/3; 438/5; 257/421
(58) Field of Search ...................... 438/3, 5; 257/421

(56) References Cited

U.S. PATENT DOCUMENTS 6,509,621 B2 * 1/2003 Nakao ...................... 257/421

* cited by examiner

*Primary Examiner*—David Nelms
*Assistant Examiner*—Renee R Berry

(57) ABSTRACT

A magnetic memory array comprises a plurality of magnetic memory cells, a magnetic shielding disposed adjacent to at least one of the magnetic memory cells to reduce magnetic interference with respect to another of the magnetic memory cells, and an insulator disposed as to separate at least a portion of the magnetic shielding from the at least one magnetic memory cell. The magnetic shielding may be a magnetic shield layer, patterned magnetic shield materials, and/or magnetic particles embedded in the insulator.

16 Claims, 15 Drawing Sheets

MAGNETIC SHIELDING FOR REDUCING MAGNETIC INTERFERENCE

BACKGROUND

Generally, a memory chip comprises a plurality of memory cells which are etched onto a silicon wafer and addressable via an array of column conducting leads (bit lines) and row conducting leads (word lines). That is, the intersection of a bit line and a word line typically constitutes the address of a memory cell. The memory cells are controlled by specialized circuits that perform functions such as identifying rows and columns of memory cells to read data from or write data to. Typically, each memory cell stores data in the form of a "1" or a "0," representing a bit of data.

An array of magnetic memory cells is often called magnetic random access memory or MRAM. MRAM is generally nonvolatile memory (i.e., a solid state chip that retains data when power is turned off). At least one type of magnetic memory cell includes a data layer and a reference layer that is separated from the data layer by an intermediate layer. The data layer may also be referred to as a bit layer, a storage layer, a sense layer, and/or other known terminology. In a magnetic memory cell, a bit of data (e.g., a "1" or "0") may be stored by "writing" into the data layer via one or more conducting leads (e.g., a bit line and a word line). The write operation is typically accomplished via a write current that sets the orientation of the magnetic moment in the data layer to a predetermined direction.

Once written, the stored bit of data may be read by providing a read current through one or more conducting leads (e.g., a read line) to the reference layer. In at least one type of magnetic memory cell, the read current sets the orientation of the magnetic moment of the reference layer in a predetermined direction. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

In at least one type of magnetic memory cells, the data layer and the reference layer are implemented using differing magnetic hardnesses. For example, the data layer may be magnetically harder and the reference layer may be magnetically softer. A harder layer typically has a relatively fixed magnetic state and its magnetic moment is oriented in one direction. It takes a relatively greater current to reverse the direction of the magnetic moment in a hard layer. The magnetic moment orientation in the soft layer is more readily reversible. The intermediate layer may comprise a non-magnetic conductive material and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

The layers described above and their respective characteristics are typical of magnetic memory cells based on tunneling magnetoresistance (TMR) effects known in the art. Other combinations of layers and characteristics may be used to make magnetic memory cells based on TMR effects. For example, a pinned reference layer and an anti-ferromagnetic layer may be used in place of the soft reference layer described above. This configuration of TMR memory cells is well known in the art and need not be described in more detail herein. See, for example, U.S. Pat. No. 6,404,674, issued to Anthony et al., and co-pending U.S. application Ser. Nos.: (1) 09/825093, entitled "Cladded Read Conductor For A Pinned-On-The-Fly Soft Reference Layer", filed on Apr. 2, 2001; and (2) 09/963171, entitled "Magneto-Resistive Device Having Soft Reference Layer", filed on Sep. 25, 2001, which are hereby incorporated by reference in their entirety for all purposes.

Still other configurations of magnetic memory cells based on other well known physical effects (e.g., giant magnetoresistance (GMR), anisotropic magnetoresistance (AMR), colossal magnetoresistance (CMR), and/or other physical effects) may be implemented with various embodiments described herein.

Throughout this application, various exemplary embodiments will be described in reference to the TMR memory cells having a relatively hard data layer, and relative soft reference layer, as described above. Those skilled in the art will readily appreciate that the exemplary embodiments may also be implemented with other types of magnetic memory cells known in the art (e.g., other types of TMR memory cells, GMR memory cells, AMR memory cells, CMR memory cells, etc.) according to the requirements of a particular implementation.

Generally speaking, desirable characteristics for any configuration of memory device include increased speed, reduced power consumption, and/or lower cost. Lower cost may be achieved by a simpler fabrication process and/or a smaller chip surface area. As the size of memory cells is reduced, however, fringe (and/or stray) magnetic fields emanating from a target memory cell during a read or write operation may cause increased magnetic interference among neighboring memory cells. Depending on the proximity of magnetic memory cells to each other and the magnitude of currents being used for read and write operations, fringe magnetic fields may even corrupt a data bit stored in the data layer of a neighboring magnetic memory cell that was not targeted for the read or write operations.

Thus, a market exists for a MRAM device in which fringe magnetic fields generated by a magnetic memory cell are materially controlled so as to reduce interference with nearby memory cells. This is especially useful in (although not limited to) high density MRAM devices.

SUMMARY

In a magnetic memory array comprising a plurality of magnetic memory cells, each of the magnetic memory cells includes a data layer and a reference layer, such that a value stored in the data layer is determinable by measuring a relative orientation of the magnetic moments of the data layer and the reference layer and each magnetic memory cell during operation emanates fringe magnetic fields potentially influencing nearly magnetic memory cells. An improvement comprises a magnetic shielding disposed adjacent to at least one of the magnetic memory cells to reduce magnetic interference with respect to another of the magnetic memory cells, and an insulator disposed as to separate at least a portion of the magnetic shielding from the at least one magnetic memory cell.

In various exemplary embodiments to be described herein, the magnetic shielding includes a magnetic shield layer, patterned magnetic shield materials, and/or magnetic particles embedded within the insulating oxide.

A method for reducing magnetic interference between at least two memory cells in a magnetic memory array device comprises creating a desired magnetic field within at least one magnetizable layer of a first memory cell by providing a current through the layer and reducing an undesirable magnetic interference between the first memory cell and a second memory cell by absorbing a fringe magnetic field emanating from the first memory cell via a magnetic shield material located in proximity to the first memory cell.

DETAILED DESCRIPTION

I. Overview

Section II describes an exemplary MRAM device, known in the background art, in connection with which the various exemplary embodiments to be described in Sections V, VI, and VII may be implemented. Section III describes an exemplary memory cell of the exemplary MRAM device. Section IV sets forth the phenomenon of magnetic interference, known in the background art, which is reduced in accordance with various exemplary embodiments to be described in Sections V, VI, and VII. Sections V, VI, and VII illustrate various exemplary embodiments of techniques for reducing magnetic interference, exemplary MRAM devices using such techniques, and exemplary manufacturing processes for such devices.

II. An Exemplary MRAM Device

Figure 1:
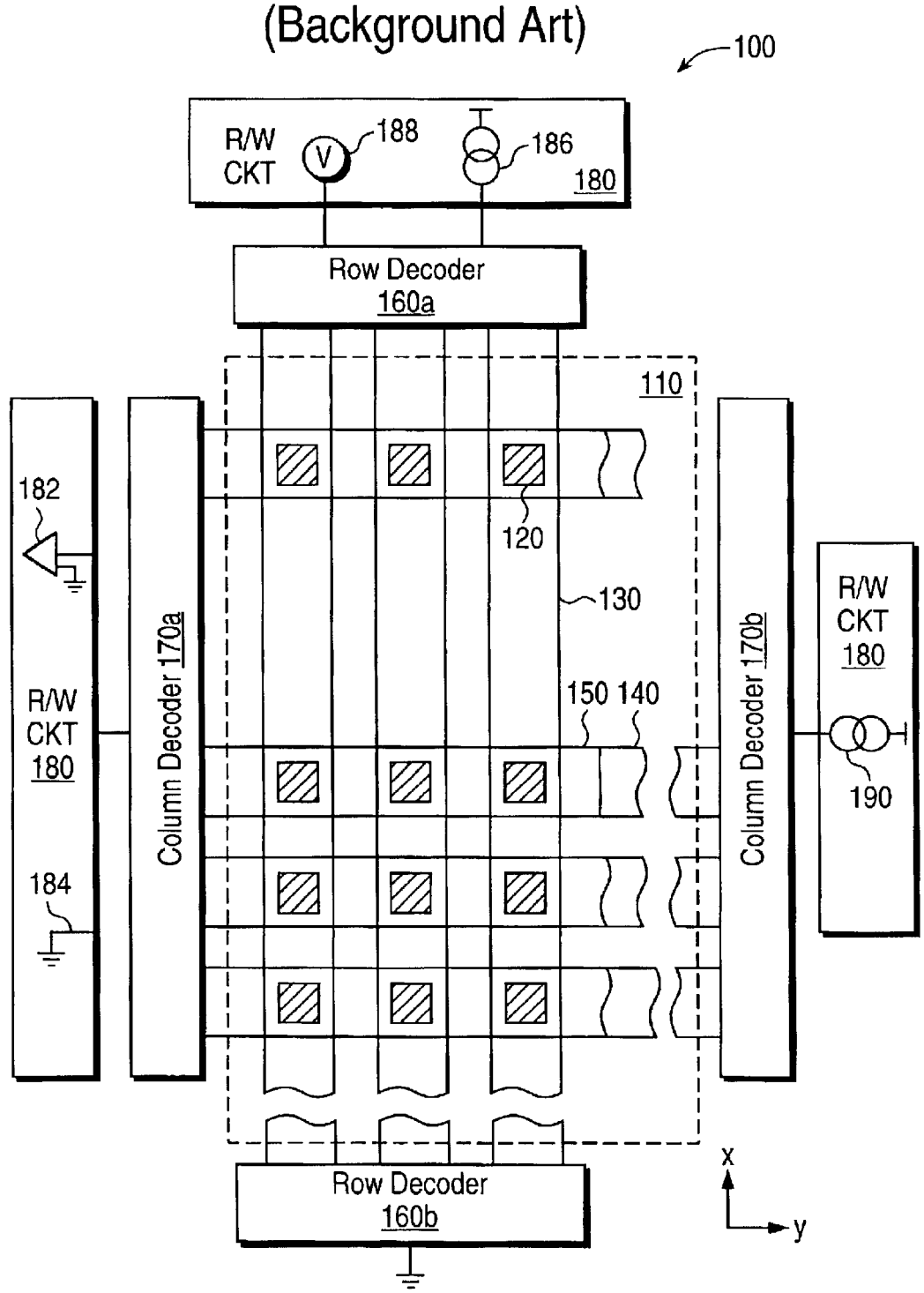
FIG. 1 illustrates an array of memory cells in an exemplary MRAM device in connection with which the techniques of this patent may be implemented.

FIG. 1 illustrates an exemplary MRAM device 100 including an array 110 of magnetic memory cells 120. The magnetic memory cells 120 are arranged in rows and columns, for example, the rows extending along the y-axis and the columns extending along the x-axis. In FIG. 1, a representative number of magnetic memory cells 120 is shown for ease of explanation purposes.

In FIG. 1, a first conducting layer (comprising word lines) 130 extends along the x-axis in the array 110. A second conducting layer (comprising bit lines) 140 extends along the y-axis in the array 110. In one embodiment, there is one word line 130 for each row of the array 110 and one bit line 140 for each column of the array 110. Further, a magnetic memory cell 120 is located at each cross point of a word line 130 and a bit line 140. An exemplary TMR magnetic memory cell 120 may include a data layer, a reference layer, and an intermediate layer (as will be illustrated in greater detail in FIG. 2). In an exemplary implementation, the word lines 130 are in contact with data layers of the magnetic memory cells 120 and the bit lines 140 are in contact with the reference layers of the magnetic memory cells 120.

A third conducting layer (comprising read lines) 150 also extends along the y-axis. In an exemplary implementation, the read lines 150 are located on top of, and insulated from, the bit lines 140. Alternatively, the read lines 150 may be located beneath the bit lines 140, on top of or beneath the word lines 130, or any other suitable configuration according to device design. Generally, the read lines 150 are independent of the word lines 130 and bit lines 140.

The MRAM device 100 also includes circuits such as a first row decoder 160a, a second row decoder 160b, a first column decoder 170a, a second column decoder 170b, and a read/write circuit 180. The read/write circuit 180 includes a sense amplifier 182, ground connection(s) 184, a row current source 186, a voltage source 188, and a column current source 190.

A. An Exemplary Write Operation

During a write operation of a target magnetic memory cell 120, the first row decoder 160a connects one end of a selected word line 130 (i.e., the word line 130 intersecting the target memory cell 120) to the row current source 186, the second row decoder 160b connects an opposite end of the selected word line 130 to ground, the first column decoder 170a connects one end of a selected bit line 140 (i.e., the bit line 140 intersecting the target memory cell 120) to ground 184, and the second column decoder 170b connects the opposite end of the selected bit line 140 to the column current source 190. As a result, write currents flow through the selected word and bit lines 130 and 140. The write currents create magnetic fields, which alter the magnetic orientation of the data layer in the target magnetic memory cell 120.

B. An Exemplary Read Operation

During a read operation of a target magnetic memory cell 120, the first row decoder 160a connects the voltage source 188 to a selected word line 130, and the first column decoder 170a connects a selected bit line 140 to a virtual ground input of the sense amplifier 182. As a result, a sense current flows through the target magnetic memory cell 120 to the input of the sense amplifier 182. Either before or after the foregoing, the first and second column decoders 170a and 170b cooperate to supply a read current through the read line 150 intersecting the target magnetic memory cell 120. The read current sets the magnetic orientation of the reference layer in the target memory cell 120 to a predetermined direction. Then, the resistance state of the target magnetic memory cell 150 may be sensed by the sense amplifier 182. Thus, the logic state of the target magnetic memory cell 120 is determined.

III. An Exemplary Magnetic Memory Cell

Figure 2:
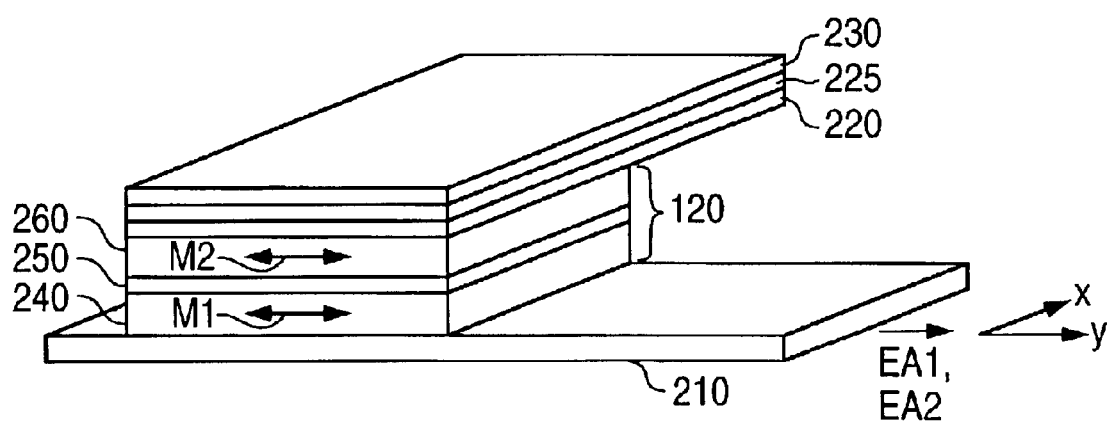
FIG. 2 illustrates an exemplary magnetic memory cell of the exemplary MRAM device of FIG. 1.

FIG. 2 illustrates a portion of an exemplary magnetic memory cell 120 using TMR effects, and the various layers associated therewith. The memory cell 120 is accessible via a first conducting layer 210 (or word line), a second conducting layer 220 (or bit line), and a third conducting layer 230 (or read line). The memory cell 120 typically comprises a data layer 240, a reference layer 260, and an intermediate layer 250 (e.g., a tunnel barrier layer) between the data layer 240 and the reference layer 260. In an exemplary embodiment, the data layer 240 and the reference layer 260 are made of ferromagnetic material. The data layer 240 has a magnetization (represented by the vector M1) that (as illustrated) can be oriented in either of two directions, typically along (i.e., either parallel or antiparallel to) easy axis (EA1) of the data layer 240. The actual direction of the vector will vary from cell to cell, depending on the value of data bit stored in the cell. The reference layer 260 has a magnetization (represented by the vector M2) that (as illustrated) can be oriented in either of two directions, typically along its easy axis (EA2). For convenience of illustration only, in this exemplary embodiment, the easy axes (EA1 EA2) are shown as extending along the x-axis. If the magnetization vectors (M1 and M2) of the data layer 240 and reference layer 260 are generally pointing in the same direction, the orientation (or state) of the magnetic memory cell 120 is said to be "parallel." If the magnetization vectors (M1 and M2) of the data layer 240 and reference layer 260 are generally pointing in opposite directions, the orientation of the magnetic memory cell 120 is said to be "anti-parallel." These two orientations of the data layer 240 and reference layer 260, parallel and anti-parallel (as determined with respect to each other), are used to represent logic values of "0" and "1," respectively (or, depending on design choice, "1" and "0").

In an exemplary embodiment, the intermediate layer 250 is a tunnel barrier layer which may comprise one or more layers of aluminum oxide ($Al_2O_3$), silicon dioxide ($SiO_2$), tantalum oxide ($Ta_2O_5$), silicon nitride ($SiN_4$), aluminum nitride (AlN), or magnesium oxide (MgO), singly or in combination. Other dielectrics and/or semiconductor materials may also be used for the intermediate layer 250. The thickness of the intermediate layer is determined so as to inhibit exchange coupling between the data and reference layers in accordance with the particular electromagnetic conditions and configuration of the cell in question. For example, in certain commercial exemplary embodiments, the intermediate layer might be about 0.5 nanometers to three nanometers thick.

Typically, the data layer 240 is magnetically harder than the reference layer 260. For example, in certain commercial implementations, the coercivity of the data layer 240 may be about 2–5 times greater than the coercivity of the reference layer 260, although the actual ratio will be a matter of design choice. The coercivities of the two layers 240 and 260 may be different as a result of different physical configurations (e.g., shapes, sizes, geometries, thicknesses, etc.) and/or compositions. In an exemplary embodiment, ferromagnetic materials suitable for the data layer 240 and the reference layer 260 include nickel iron (NiFe), nickel iron cobalt (NiFeCo), cobalt iron (CoFe), other magnetically soft alloys of NiFe and Co, doped amorphous ferromagnetic alloys, PERMALLOY™, and other materials. The data layer 240 and the reference layer 260 are not necessarily (and in fact often are not) made of the same material.

In an exemplary embodiment, the first conducting layer 210 is in contact with the data layer 240 and the second conducting layer 220 is in contact with the reference layer 260. In the exemplary embodiment of FIG. 2, the first and second conducting layers 210 and 220 are shown as being orthogonal, which is often a convenient geometric choice. However, this is not necessarily required.

The location of the third conducting layer 230 is also a matter of design choice. For example, in the exemplary embodiment of FIG. 2, the third conducting layer 230 is located above and insulated from the second conducting layer 220. The second and third conducting layers 220 and 230 may be separated by an electrical insulator 225 (e.g., a layer of dielectric material). The conducting layers 210, 220 and 230 may be made of an electrically conductive material such as aluminum, copper, gold, silver, or other materials.

Data may be written to the magnetic memory cell 120 by supplying write currents to the first and second conducting layers 210 and 220. Typically, a current supplied to the first conducting layer 210 creates a magnetic field about the first conducting layer 210 and a current supplied to the second conducting layer 220 creates a magnetic field about the second conducting layer 220. During a write operation, the combined respective magnetic fields should exceed the coercivity of the data layer 240 to cause the magnetization vector (M1) of the data layer 240 to be set in a desired orientation (such orientation typically depends on the direction of the currents being supplied to the first and second conducting layers 210 and 220).

Because the coercivity of the reference layer 260 is typically less than that of the data layer 240 (at least in this type of exemplary TMR memory cell), the combined magnetic fields (about the first conducting layer 210 and the second conducting layer 220) may cause the magnetization vector (M2) of the reference layer 260 to assume the same orientation as the magnetization vector (M1) of the data layer 240.

When write currents are removed from the first and second conducting layers 210 and 220, the magnetization vector (M1) of the data layer 240 generally retains its orientation. However, the magnetization vector (M2) of the reference layer 260 may or may not retain its orientation. For example, if the reference layer 260 is "ultrasoft" (i.e., not pinned, or is capable of being "pinned-on-the-fly") it may lose its magnetization orientation when the write currents are removed from the first and second conducting layers 210 and 220. Materials and methods for making an ultrasoft reference layer are disclosed in U.S. Pat. No. 6,404,674 and co-pending U.S. application Ser. Nos.: (1) 09/825093, entitled "Cladded Read Conductor For A Pinned-On-The-Fly Soft Reference Layer", filed on Apr. 2, 2001; and (2) 09/963171, entitled "Magneto-Resistive Device Having Soft Reference Layer", filed on Sep. 25, 2001, which have been incorporated by reference in their entirety above.

Data may be read from the magnetic memory cell 120 by supplying a read current to the third conducting layer 230. Typically, a current supplied to the third conducting layer 230 creates a magnetic field about the third conducting layer 230. In an exemplary embodiment, the magnetic field sets the magnetization vector (M2) of the reference layer 260 in a desired direction. During a read operation, sense and parasitic currents flow through the first and second conducting layers 210 and 220, respectively, and may be sensed by the sense amplifier 182 (see FIG. 1). The resistance in the magnetic cell 120 (i.e., between the data layer 240 and the reference layer 260) is determined based on the current sensed by the sense amplifier 182, and the logic state is "read" by determining the value of the resistance.

In an exemplary implementation, the first, second, and third conducting layers correspond to the word, bit, and read lines of the device, respectively. However, it should be understood that this particular correspondence is merely exemplary rather than restrictive. In addition, the labels "first," "second" and "third" are used for convenience of discourse, and not intended to denote any particular numerical quantitative, or other requirement among the various layers.

Further, the type of magnetic memory cell and its structure described above and illustrated in FIG. 2 (i.e., one type of TMR memory cell) are merely exemplary. Those skilled in the art will appreciate that other types of memory cells (e.g., GMR memory cells, etc.) as well as other memory cell structures may used according to the requirements of a particular implementation. For example, the various layers as illustrated in FIG. 2 may be formed in accordance with other manufacturing sequences (e.g., the reference layer 260 may be formed before the data layer 240), one or more layers may be formed at the same time, one or more other layers (not shown) may be added or removed, etc. Other types of memory cells and memory cell structures are known in the art and need not be described in more detail herein.

IV. Fringe Fields Causing Magnetic Interference Among Magnetic Memory Cells

As mentioned earlier, one important design goal in the microelectronics field generally is to reduce the size of microelectronic devices. The size of a MRAM device may be reduced by placing the magnetic memory cells 120 closer to each other. However, as the spacing between magnetic memory cells become smaller, the likelihood of magnetic interference caused by fringe magnetic fields among the memory cells increase. Depending on the proximity of the memory cells to each other and the magnitude of applied currents to a target memory cell, fringe magnetic fields emanating from that target memory cell may even corrupt a data bit stored in neighboring memory cells.

As described herein in accordance with various exemplary embodiments, magnetic shielding (e.g., magnetic shield materials) can be used to reduce or sink (e.g., absorb) such fringe magnetic fields, thus reducing magnetic interference among magnetic memory cells. Some magnetic shielding might include one or more layers of magnetic materials such as ferromagnets or ferrites. Examples of ferromagnetic materials include alloys of nickel (Ni), iron (Fe), and cobalt (Co) (e.g., nickel iron (NiFe), nickel iron cobalt (NiFeCo), cobalt iron (CoFe), other magnetically soft (i.e., having relatively high permeability) alloys of NiFe and Co, etc.) of various combinations, doped amorphous ferromagnetic alloys, PERMALLOY™, and other materials. Examples of ferrites include ceramic-based magnetic materials. Soft ferrites are especially beneficial for, although not limited to, high-frequency applications.

The magnetic shielding may also be referred to as magnetic sink, magnetic shield materials, cladding, field sink, and/or other terminology. Generally, the amount of magnetic shielding, its physical configuration, and placement adjacent the memory cells depend on the magnitude of the fringe magnetic fields generated at the edges of the memory cells. Thus, the composition, physical configuration, and location of magnetic shield materials may be different for different types of memory cells. For example, the composition of the magnetic shielding for memory cells with synthetic ferrimagnet layers may be different than the composition of the magnetic shield material for memory cells with ferromagnetic layers (which generate stronger fringe magnetic fields). As used herein, adjacent includes near, next to, close by, in proximity to, and/or other physical configuration(s) that will be apparent to one skilled in the art.

Various exemplary embodiments of using magnetic shield materials to reduce magnetic interference are described below.

V. An Exemplary Embodiment for Reducing Magnetic Interference

In one embodiment, a magnetic shield layer is placed either below or above (or on both sides of) the bit plane. Typically, the magnetic shield layer is placed close to the source of fringe magnetic fields (e.g., close to the magnetic memory cells). The bit plane is typically taken to be the plane of the magnetic memory cells.

A. Exemplary MRAM Devices Having One or More Magnetic Shield Layer(s)

Figure 3A:
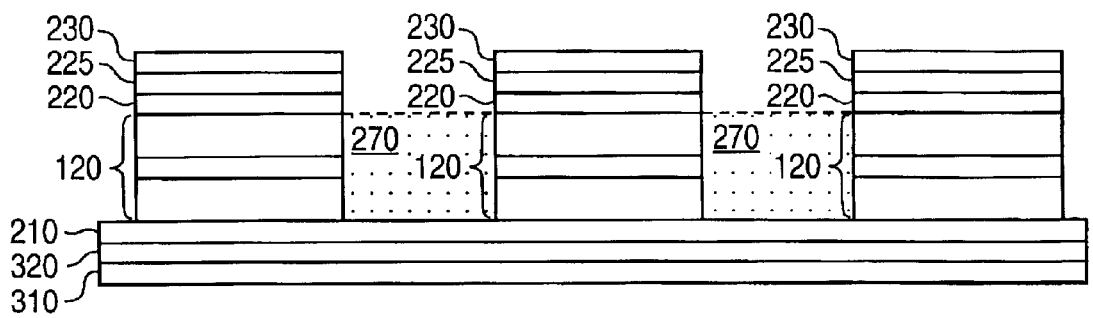
FIGS. 3a–3c illustrate MRAM devices having one or more magnetic shield layers in accordance with various exemplary embodiments.
Figure 3B:
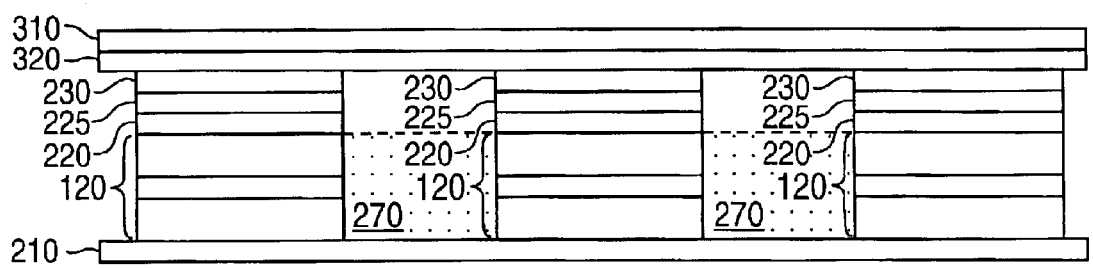
Figure 3C:
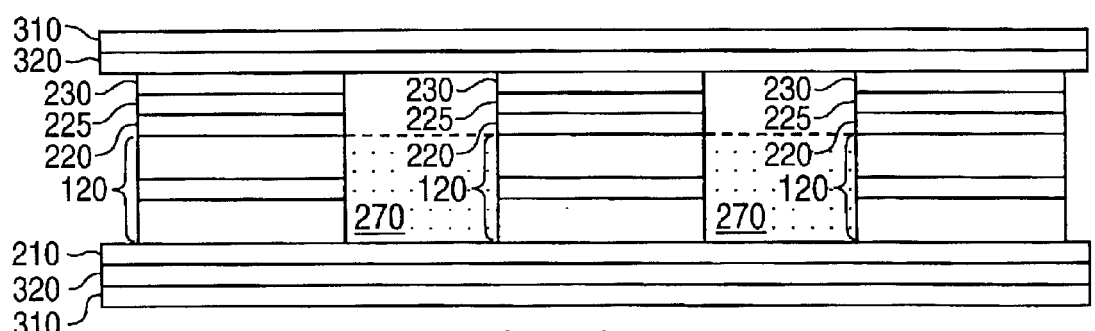

FIGS. 3a–3c illustrate, respectively, three exemplary MRAM devices with magnetic shield layers.

FIG. 3a illustrates an elevation view of a MRAM device having a magnetic shield layer below the bit plane in accordance with one exemplary embodiment. FIG. 3a includes a magnetic shield layer 310, an insulating layer 320 on top of the magnetic shield layer 310, a first conducting layer 210 on top of the magnetic shield layer 310, multiple memory cells 120 on top of the first conducting layer 210, the second conducting layer 220 on top of the memory cells 120, an insulating layer 225 on top of the second conducting layer 220, and a third conducting layer 230 on top of the insulating layer 225. In an exemplary embodiment, the space between one or more of the memory cells 120 is filled with insulating material 270 (e.g., dielectric material, etc.) that insulates the memory cells from each other. The magnetic shield layer 310 may comprise one or more layers of the same or different ferromagnetic material (as disclosed above) or other suitable magnetic material.

FIG. 3b illustrates an elevation view of a MRAM device having a magnetic shield layer above the bit plane in accordance with another exemplary embodiment. FIG. 3b includes a first conducting layer 210, multiple memory cells 120 on top of the first conducting layer 210, insulating material 270 between the memory cells 120, a second conducting layer 220 on top of the memory cells 120, an insulating layer 225 on top of the second conducting layer 220, a third conducting layer 230 on top of the insulating layer 225, another insulating layer 320 on top of the third conducting layer 230, and a magnetic shield layer 310 on top of the insulating layer 320.

FIG. 3c illustrates an elevation view of a MRAM device having a first magnetic shield layer above and a second magnetic shield layer below the bit plane in accordance with yet another exemplary embodiment. FIG. 3c includes a first magnetic shield layer 310, an insulating layer 320 on top of the first magnetic shield layer, a first conducting layer 210, multiple memory cells 120 on top of the first conducting layer 210, insulating material 270 between the memory cells 120, a second conducting layer 220 on top of the memory cells 120, an insulating layer 225 on top of the second conducting layer 220, a third conducting layer 230 on top of the insulating layer 225, another insulating layer 320 on top of the third conducting layer 230, and a second magnetic shield layer 310 on top of the insulating layer 320.

Figure 4A:
FIGS. 4a–4c illustrate an exemplary process for forming a magnetic shield layer below the bit plane.
Figure 4B:
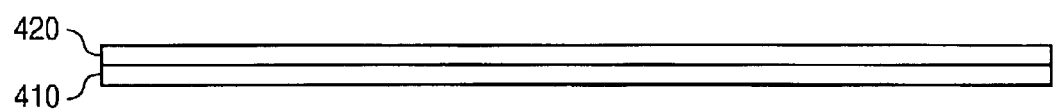
Figure 4C:
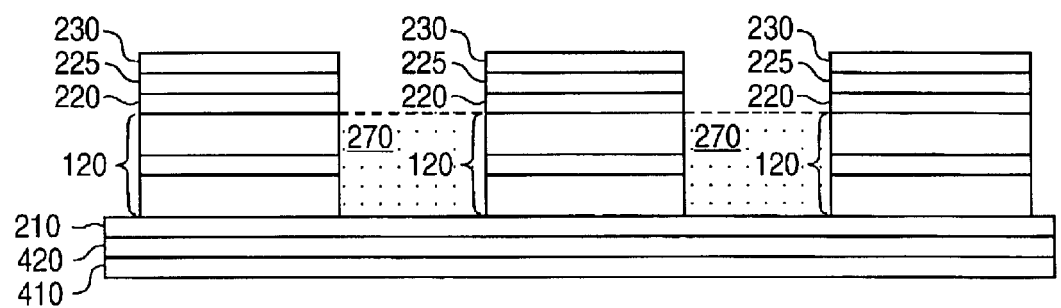
Figure 4D:
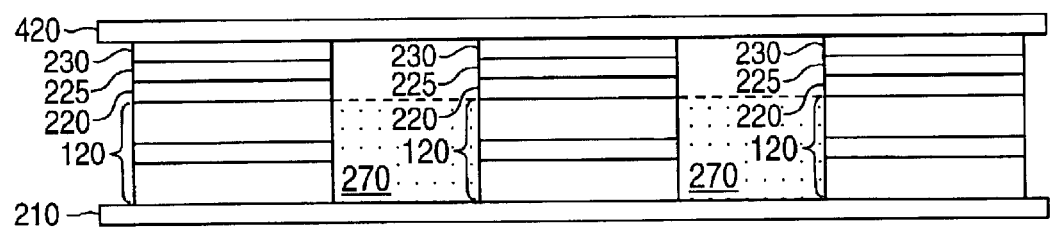
FIGS. 4d–4e illustrate an exemplary process for forming a magnetic shield layer on top of the bit plane.
Figure 4E:
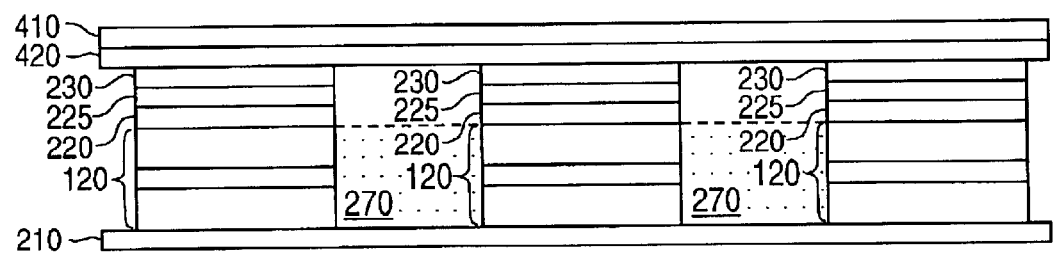
Figure 4F:
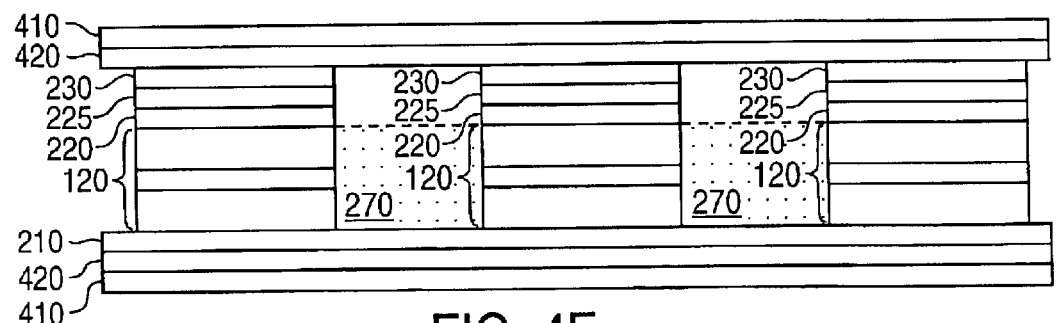
FIG. 4f illustrates an exemplary process for forming a magnetic shield layer both below and on top of the bit plane.

B. Exemplary Processes for Making MRAM Devices Having One or More Magnetic Shield Layers FIGS. 4a–4c illustrate an exemplary process for forming a magnetic shield layer below the bit plane. FIGS. 4d–4e illustrate an exemplary process for forming a magnetic shield layer on top of the bit plane. FIG. 4f illustrates an exemplary process for forming a magnetic shield layer both below and on top of the bit plane.

In FIG. 4a, a magnetic shield layer 410 is formed on a substrate (not shown). In an exemplary embodiment, the magnetic shield layer 410 is formed by plasma-assisted deposition, direct-current (DC) or radio-frequency (RF) sputtering, physical vapor deposition, e-beam evaporation, and/or other suitable processes known in the art. Preferably, the magnetic shield layer 410 has high permeability, low stress, low magnetostriction, high anisotropy (in a known and controllable direction), and/or otherwise substantially uniform properties. The typical thickness of the magnetic shield layer 410 is determined so as to reduce fringe magnetic fields without interfering with normal functions of the memory cells 120 and in accordance with the particular electromagnetic conditions and configuration of the memory device. For example, in an exemplary implementation, the thickness may range between 0.5 to 50 nanometers, depending on design requirements. The magnetic shield layer 410 may be formed along the x-axis, the y-axis, or other directions depending on design requirements. As shown in FIG. 4a, for convenience of illustration only, the magnetic shield layer 410 is formed along the x-axis.

In FIG. 4b, an insulating layer 420 (e.g., of dielectric material, etc.) is formed on top of the magnetic shield layer 410. In an exemplary embodiment, the insulating layer 420 is formed in accordance with methods known in the art (e.g., sputtering, vapor depositing, etc.) and its thickness is determined so as to inhibit exchange coupling between the magnetic shield layer 410 and the data layers in the memory cells 120. For example, in an exemplary implementation, the thickness may range between 20 to 500 nanometers, where a thickness between 50 to 100 nanometers is the typical value.

Next, in FIG. 4c, the first conducting layer 210, magnetic memory cells 120, insulating material 270, second conducting layer 220, an insulating layer 225, and third conducting layer 230 are formed in accordance with methods known in the art. For example, the first conducting layer 210 may be formed using electroplating or other suitable deposition process then planarized by a planarizing process such as chemical mechanical planarization (CMP).

FIGS. 4d–4e illustrates an exemplary process for forming the magnetic shield layer 410 on top of the memory cells 120. In this exemplary process, the insulating layer 420 is first formed on top of the third conducting layer 230 as shown in FIG. 4d. In FIG. 4e, the magnetic shield layer 410 is formed on top of the insulating layer 420.

FIG. 4f illustrates an exemplary process for forming magnetic shield layers 410 both below and on top of the memory cells 120. In this exemplary process, one or more of the processes described above may be combined and implemented to produce the exemplary device shown in FIG. 4f. In this Figure, the numbered elements have the same meanings as shown in FIGS. 4a–4e, and so need not be set forth again.

In normal configurations of a MRAM device, current-carrying conducting leads (e.g., bit lines, word lines, and read lines) are placed in close proximity to the memory cells for read and write operations. As a result, design constraints may prohibit the use of one or more magnetic shield layers as disclosed in this embodiment. Exemplary alternative embodiments are thus disclosed below.

VI. Another Exemplary Embodiment for Reducing Magnetic Interference

In another exemplary embodiment, small amounts of magnetic shield material are placed in the same or different plane as the bit plane for reducing magnetic interference. In one implementation, one or more magnetic shield layers as described above are formed, then the magnetic shield layers are patterned into small amounts of magnetic shield materials. As explained above, patterned magnetic shield materials may be preferred over magnetic shield layers as a matter of design choice. The physical configurations (e.g., shape, size, etc.) of the patterned magnetic shield materials are also determined as a matter of design choice. For example, the patterned magnetic shield material may form strips, loops, claddings, crosses, bars, etc. between the memory cells.

A. Exemplary MRAM Devices Having Patterned Magnetic Shield Materials

Figure 5A:
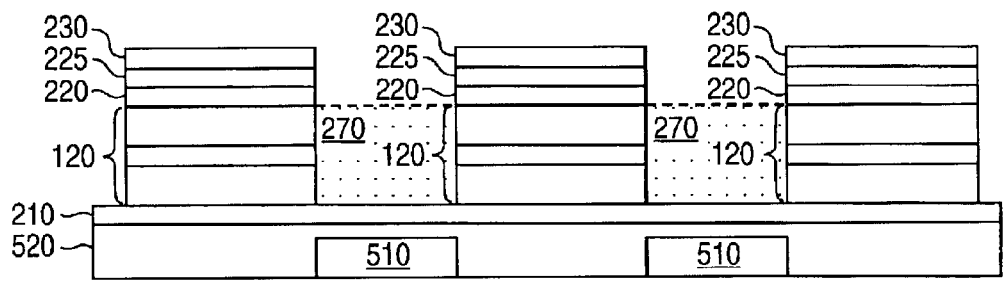
FIGS. 5a–5c illustrate patterned magnetic shield materials below, on top of, or in the same plane as the bit plane, respectively.
Figure 5B:
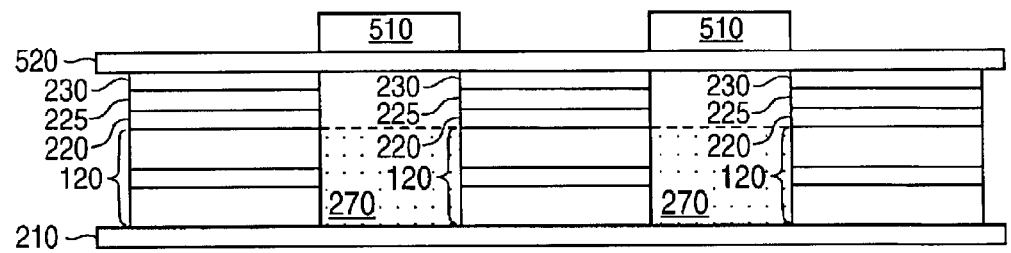
Figure 5C:
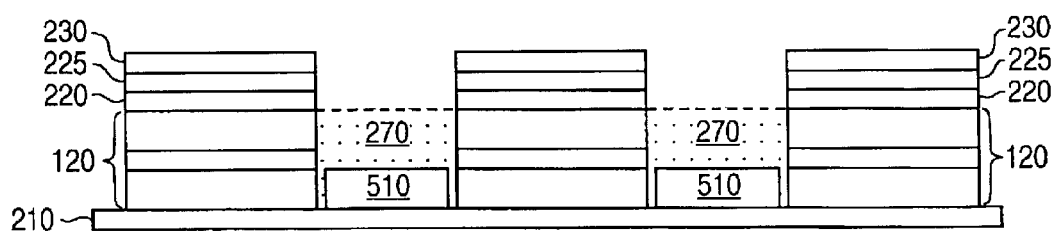

Patterned magnetic shield materials may be below, above, or in the same plane as the bit plane, as illustrated in FIGS. 5a, 5b, and 5c, respectively.

FIG. 5a illustrates an elevation view of a MRAM device having patterned magnetic shield materials 510 in a plane below the memory cells 120. FIG. 5a includes patterned magnetic shield materials 510, insulating material 520 on top of the patterned magnetic shield materials that optionally insulates the patterned magnetic shield materials 510 from each other, the first conducting layer 210 on top of the insulating material 520, multiple memory cells 120 on top of the first conducting layer 210, insulating material 270 between the memory cells 120, the second conducting layer 220 on top of the multiple memory cells 120, another insulating layer 225 on top of the second conducting layer 220, and the third conducting layer 230 on top of the insulating layer 225. Generally, the primary purpose of the insulating material 520 is to insulate the patterned magnetic shield materials 510 from the first conducting layer 210. In addition, the insulating material 520 may prevent exchange coupling between the patterned magnetic shield materials 510.

In general, the patterned magnetic shield materials 510 in FIG. 5a may overlap with the magnetic memory cells 120 because the patterned magnetic shield materials 510 are not in the same plane as the magnetic memory cells 120 (i.e., typically no exchange coupling concerns). The extent of overlap and/or the physical configuration of the patterned magnetic shield materials are design choices to be made based at least on the amount and direction of magnetic shielding desired.

FIG. 5b illustrates an elevation view of a MRAM device having patterned magnetic shield materials 510 in a plane above the memory cells 120. FIG. 5b includes the first conducting layer 210 5, multiple memory cells 120 on top of the first conducting layer 210, insulating material 270 between the memory cells 120, the second conducting layer 220 on top of the multiple memory cells 120, an insulating layer 225 on top of the second conducting layer 220, the third conducting layer 230 on top of the insulating layer 225, insulating material 520 on top of the third conducting layer 230, and patterned magnetic shield materials 510 on top of the insulating material 520. Generally, the primary purpose of the insulating material 520 is to insulate the patterned magnetic shield materials 510 from the third conducting layer 230.

Similar to FIG. 5a, the patterned magnetic shield materials 510 in FIG. 5b may generally overlap with the magnetic memory cells 120 because the patterned magnetic shield materials 510 are not in the same plane as the magnetic memory cells 120 (i.e., typically no exchange coupling concerns). The extent of overlap and/or the physical configurations of the patterned magnetic shield materials are design choices to be made based at least on the amount and direction of magnetic shielding desired.

FIG. 5c illustrates an elevation view of a MRAM device having patterned magnetic shield materials 510 in the same plane as the memory cells 120. FIG. 5c includes the first conducting layer 210, patterned magnetic shield materials 510 and multiple memory cells 120 in the same plane on top of the first conducting layer 210, insulating material 270 between the memory cells 120 and the patterned magnetic shield materials 510, the second conducting layer 220 on top of the multiple memory cells 120, another insulating layer 225 on top of the second conducting layer 220, and the third conducting layer 230 on top of the insulating layer 225. Generally, the primary purpose of the insulating material 270 is to insulate the memory cells 120 and patterned magnetic shield materials 510 from each other to prevent exchange coupling.

In FIG. 5c, the patterned magnetic shield materials 510 are spaced apart from the magnetic memory cells 120 to prevent exchange coupling. In an exemplary implementation, spacing (e.g., gaps) between the patterned magnetic shield materials 510 and their respective adjacent magnetic memory cells 120 is wide enough to electrically isolate one from the other. For example, the spacing as implemented may be approximately 10 nanometers. Of course, smaller (or larger) spacing may be implemented in accordance with the specific design requirements.

The patterned magnetic shield materials 510 may or may not be the same material and/or thickness as the data layers 240 (refer back to FIG. 2) in the memory cells 120. Accordingly, the patterned magnetic shield materials 510 may be formed during the same process steps or different process steps of those for forming the data layers 240.

Whether the patterned magnetic materials are located above, below or in the same plane as the bit plane, they may be patterned into different shapes depending on design requirements. FIGS. 5d–5i illustrate exemplary shapes of patterned magnetic materials regardless of the plane in which they are located. The physical configurations (e.g., shape, size, etc.) of the patterned magnetic shield materials are design choices to be made based at least in part on the amount and direction of magnetic shielding desired.

Figure 5D:
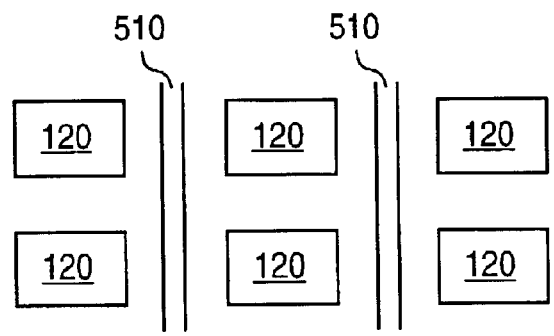
FIGS. 5d–5i illustrate exemplary physical configurations of patterned magnetic materials regardless of the plane in which they are implemented.

FIG. 5d illustrates a plan view of a MRAM device having patterned magnetic strips 510 located vertically to one side of the memory cells 120 in a memory cell array.

Figure 5E:
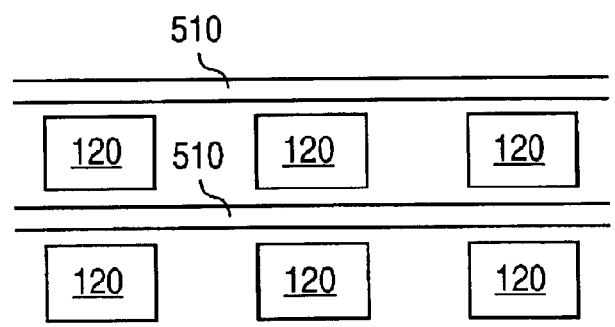

FIG. 5e illustrates a plan view of a MRAM device having patterned magnetic shield strips 510 located horizontally to one side of the memory cells 120 in a memory cell array.

Figure 5F:
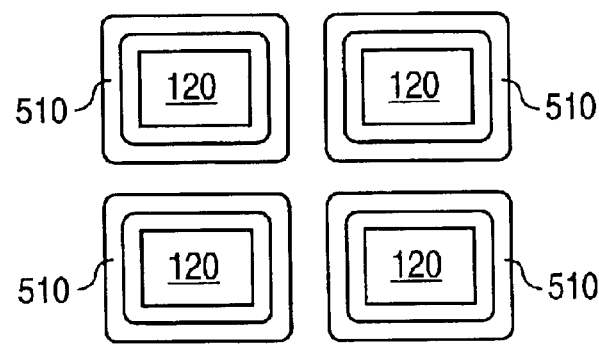

FIG. 5f illustrates a plan view of a MRAM device having patterned magnetic shield loops (e.g., ellipses, ovals, circles, rings, squares, rectangles, etc.) 510 around the memory cells 120 in a memory cell array. It should be understood that the term "loop" means a closed loop that is not necessarily circular.

Figure 5G:
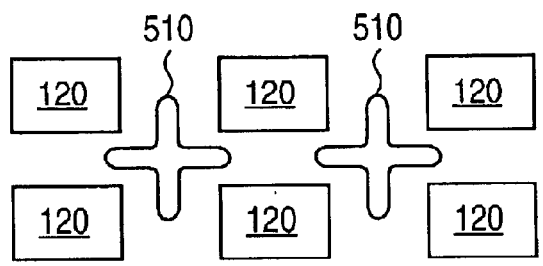

FIG. 5g illustrates a plan view of a MRAM device having patterned magnetic shield crosses 510 between the memory cells 120 in a memory cell array.

Figure 5H:
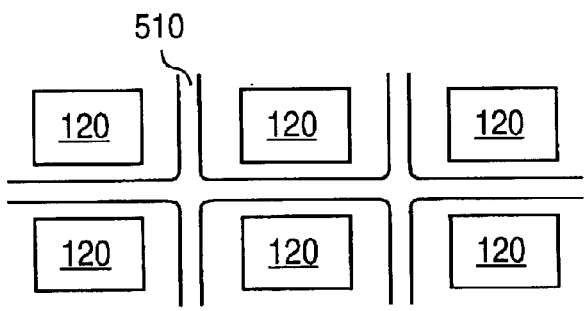

FIG. 5h illustrates a plan view of a MRAM device having patterned magnetic shield strips 510 located horizontally and vertically around the memory cells 120 in a memory cell array.

Figure 5I:
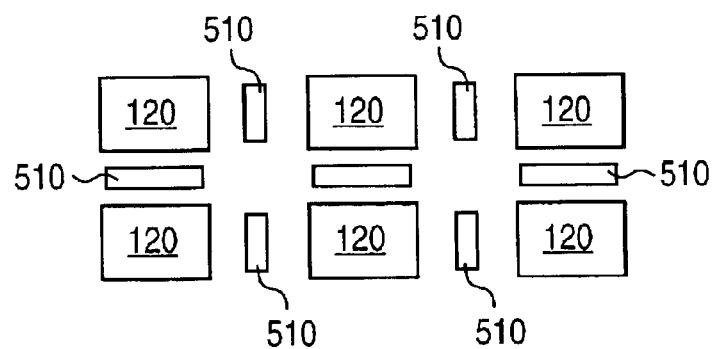

FIG. 5i illustrates a plan view of a MRAM device having patterned magnetic shield bars 510 around the sides of the memory cells 120 in a memory cell array.

In an exemplary embodiment, the patterned magnetic shield materials 510 are typically insulated from the memory cells 120 by an insulating material 520, such as dielectric material to prevent exchange coupling between the memory cells 120 and the patterned magnetic shield materials 510.

B. Exemplary Processes for Forming Patterned Magnetic Shield Materials Below or Above the Bit Plane FIGS. 6a–6d illustrate an exemplary process for forming patterned magnetic shield materials below the bit plane. FIGS. 6e–6g illustrate an exemplary process for forming patterned magnetic shield materials above the bit plane.

Figure 6A:
FIGS. 6a–6d illustrate an exemplary process for forming patterned magnetic shield materials below the bit plane.
Figure 6B:
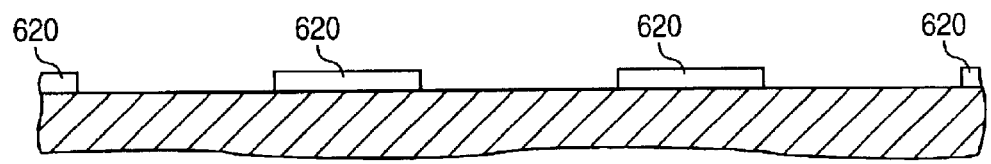
Figure 6C:
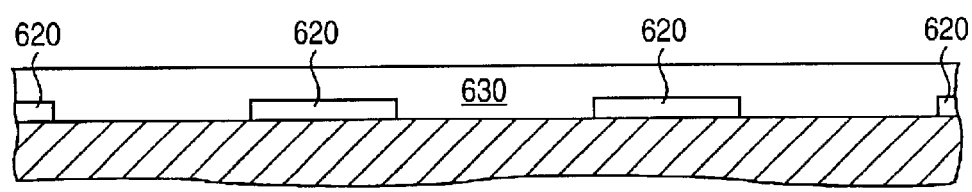
Figure 6D:
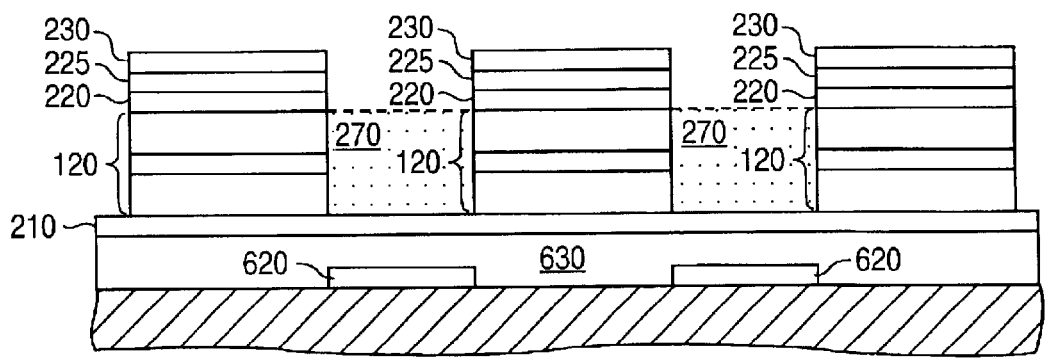
Figure 6E:
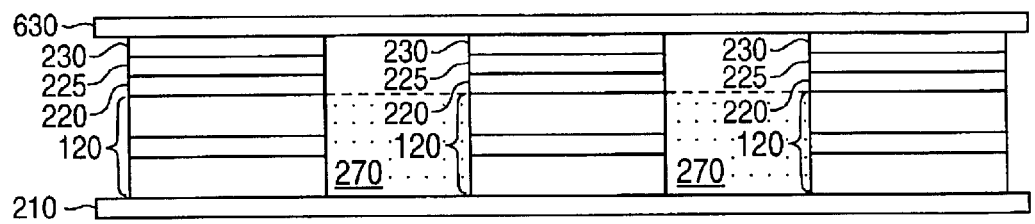
FIGS. 6e–6g illustrate an exemplary process for forming patterned magnetic shield materials above the bit plane.
Figure 6F:
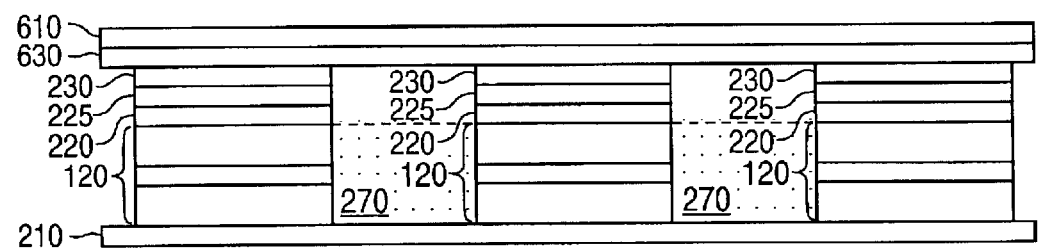
Figure 6G:
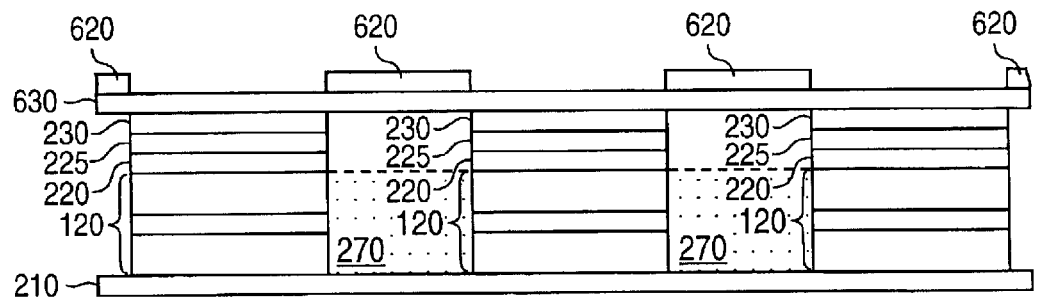

In FIG. 6a, a magnetic shield layer 610 is formed. The magnetic shield layer 610 may be formed by methods as described above in FIG. 4a. Next, in FIG. 6b, the magnetic shield layer 610 is patterned to desired shapes 620 according to design choice (e.g., strips, boxes, loops, crosses, bars, etc.). In an exemplary implementation, the magnetic shield layer 610 is patterned using patterning processes known in the art (e.g., coating with photoresist, using appropriate mask and light to cause chemical reaction to desired areas on the layer, stripping certain areas on the layer to leave a desired pattern, etc.). Next, in FIG. 6c, an insulating layer 630 is formed on top of the patterned magnetic shield materials 620. In an exemplary implementation, the insulating layer 630 may also be patterned (not shown) in accordance with design requirements. In FIG. 6d, the first conducting layer 210, magnetic memory cells 120, insulating material 270 between the memory cells 120, second conducting layer 220, another insulating layer 225, and third conducting layer 230 are formed in accordance with methods known in the art.

FIGS. 6e–6g illustrate an exemplary process for forming patterned magnetic shield materials above the bit plane. Similar to the processes described in FIGS. 4d–4e, an insulating layer 630 is formed on top of the third conducting layer 230 as shown in FIG. 6e. In FIG. 6f, the magnetic shield layer 610 is formed on top of the insulating layer 630. Next, in FIG. 6g, the magnetic shield layer 610 is patterned into various shapes 620 in accordance with design choice.

Figure 7A:
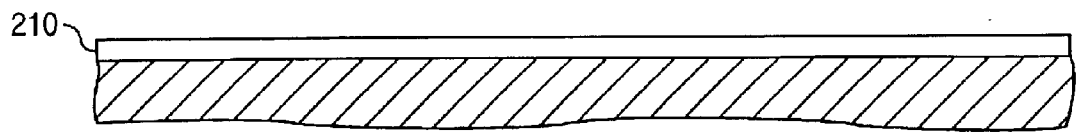
FIGS. 7a–7g illustrate an exemplary process for forming patterned magnetic shield materials in the same plane as the bit plane.
Figure 7B:
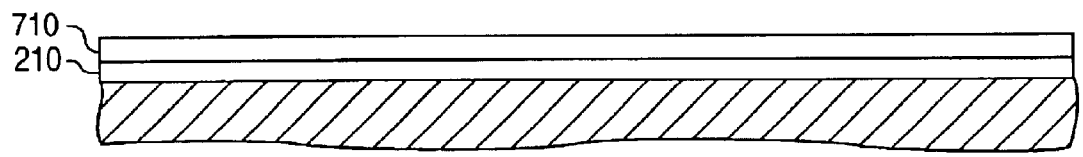
Figure 7C:
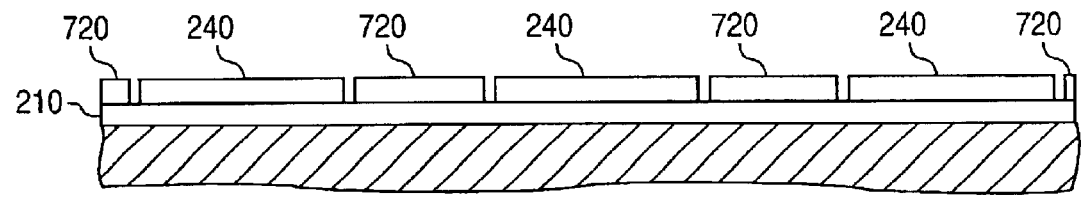
Figure 7D:
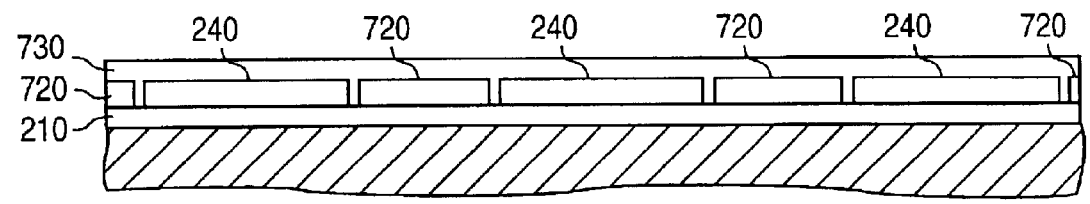

C. An Exemplary Process for Forming Patterned Magnetic Shield Materials in the Same Plane as the Bit Plane FIGS. 7a–7g illustrate an exemplary process for forming patterned magnetic shield materials in the same plane as the bit plane. In FIG. 7a, a first conducting layer 210 is formed. Next, in FIG. 7b, a ferromagnetic layer 710 is formed on top of the first conducting layer 210. The ferromagnetic layer 710 may comprise one or more layers of the same or different material depending on design specifications. In FIG. 7c, the ferromagnetic layer 710 is patterned to form data layers 240 and magnetic shield materials 720. The ferromagnetic layer 710 may be deposited on the first conducting layer 210 via suitable sputtering methods known in the art or other methods. Next, in FIG. 7d, a dielectric layer 730 is formed on top of the data layers 240, the magnetic shield materials 720, and the spaces between them. In an exemplary implementation, the dielectric layer 730 also forms the tunnel barrier layers 250 and a portion of the insulating material 270 between the memory cells 120.

Figure 7E:
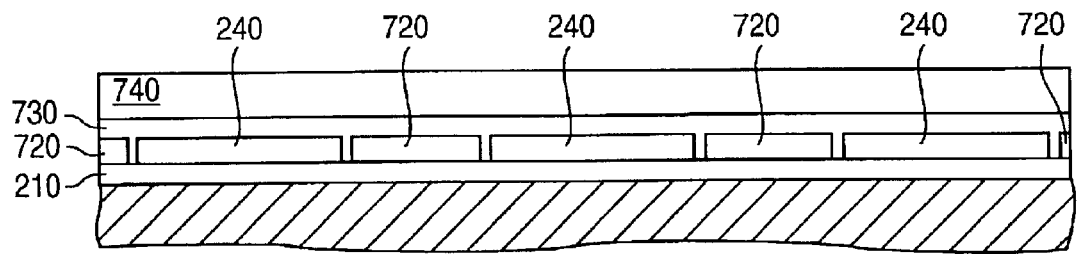
Figure 7F:
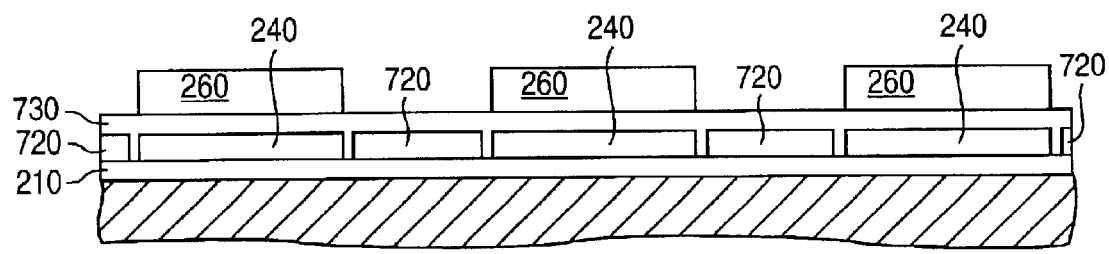

In FIG. 7e, another ferromagnetic layer 740 is formed on top of the dielectric layer 730. The ferromagnetic layer 740 may comprise one or more layers of the same or different material depending on design specifications. In FIG. 7f, the ferromagnetic layer 740 is patterned to form reference layers 260 on top of the data layers (with a layer of dielectric material in between). Next, in FIG. 7g, insulating material 270 is formed on top of the dielectric layer 730 to prevent exchange coupling between the reference layers 260.

Figure 7G:
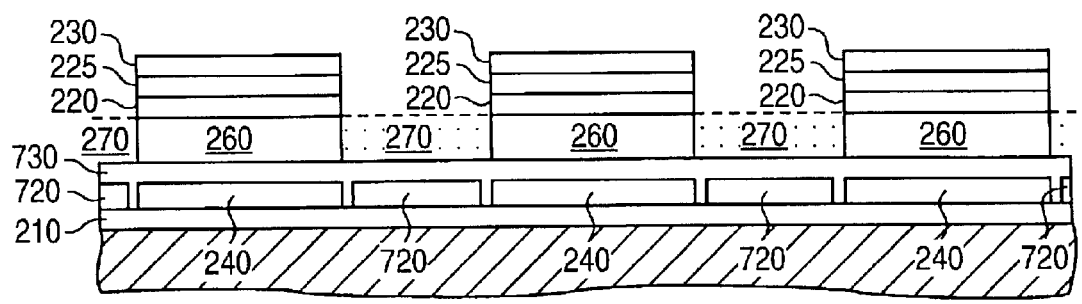

Further, in FIG. 7g, the second conducting layer 220 is formed on top of the reference layer 260. In an exemplary implementation, the second conducting layer 220 is formed using the same or other method as the first conducting layer 210. Next, an electrically insulating layer 225 is formed on top of the second conducting layer 220. Lastly, the third conducting layer 230 is formed on top of the insulating layer 225.

In another exemplary implementation, the magnetic shield materials 720 may be formed independently from the steps for forming the data layers 240. Further, the magnetic shield materials 720 may be of different material, shape, thickness, composition, and/or have other characteristics than that of the data layers 240.

VII. Another Exemplary Embodiment for Reducing Magnetic Interference

In yet another exemplary embodiment, insulating material 270 between memory cells 120 is doped with magnetic material. In normal configurations of a MRAM device, design constraints may prohibit the use of magnetic shield layers or patterned magnetic shield materials as disclosed in above exemplary embodiments. Yet another exemplary alternative embodiment is thus disclosed herein.

Figure 8:
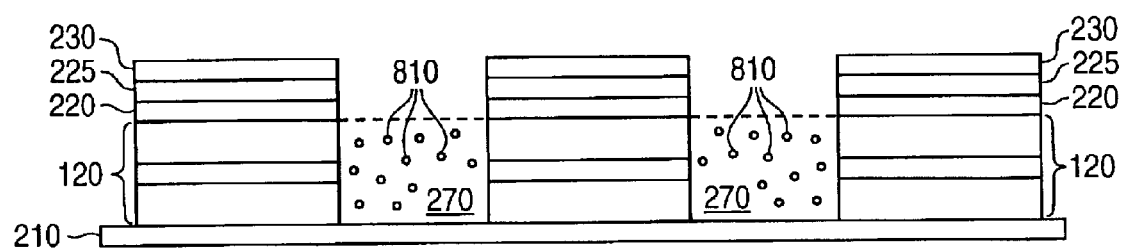
FIG. 8 illustrates an exemplary MRAM device having magnetically doped insulating material between magnetic memory cells.

A. An Exemplary MRAM Device Having Magnetically Doped Insulating Material between Magnetic Memory Cells FIG. 8 illustrates an exemplary MRAM device having magnetically doped insulating material 270 between magnetic memory cells. FIG. 8 includes multiple memory cells 120 in an array of memory cells that are separated by dielectric material 270 to prevent exchange coupling between the memory cells 120. The dielectric material 270 includes magnetic particles 810 that are present to reduce fringe magnetic fields emanating from either of the adjacent memory cells from interfering with the other.

Generally, the amount of the magnetic particles 810 embedded in the dielectric material 270 should be enough to reduce fringe magnetic fields yet not be over-abundant as to render the insulating material 270 conducting. Typically, one or more of the soft ferromagnetic materials as disclosed above may be used in accordance with this exemplary embodiment.

B. An Exemplary Process for Forming Magnetically Doped Insulating Material between Magnetic Memory Cells FIGS. 9a–9g illustrate an exemplary process for forming magnetically doped insulating material between magnetic memory cells.

Figure 9A:
FIGS. 9a–9g illustrate an exemplary process for forming magnetically doped insulating material between magnetic memory cells.
Figure 9B:
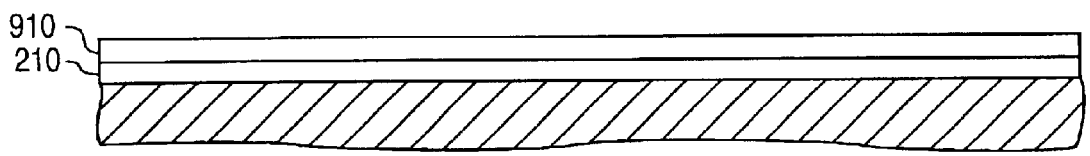
Figure 9C:
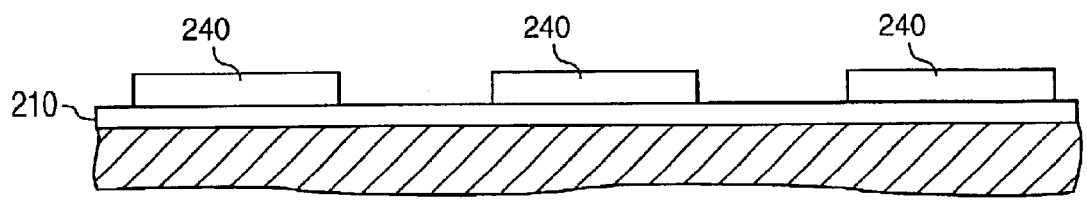
Figure 9D:
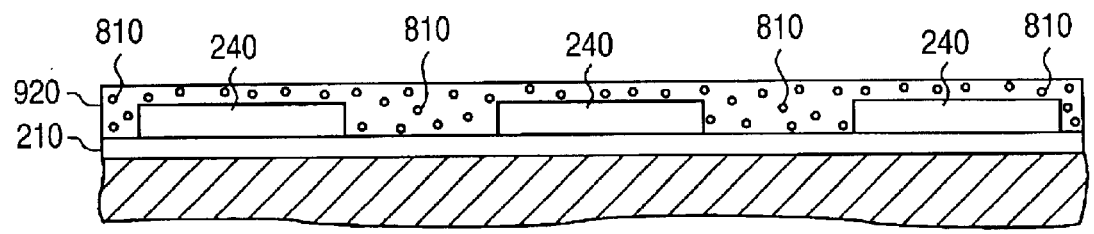

In FIG. 9a, the first conducting layer 210 is formed. Next, in FIG. 9b, a ferromagnetic layer 910 is formed on top of the first conducting layer 910. The ferromagnetic layer 910 may comprise one or more layers of the same or different material depending on design specifications. In FIG. 9c, the ferromagnetic layer 910 is patterned to form data layers 240. Next, in FIG. 9d, a dielectric layer 920 is formed on top of the data layers 240. In an exemplary implementation, the dielectric layer 920 covers both the data layers 240 and the area between the data layers 240. In this implementation, the dielectric layer 920 includes some ferromagnetic particles 810. For example, the dielectric layer 920 may be formed via a co-sputtering process in which ferromagnetic material and dielectric material are sputtered at the same time. In another exemplary implementation, the dielectric layer 920 (including some ferromagnetic particles 810) is formed via a co-evaporation process or a plasma oxidation of a deposited metal film. For example, if NiFe, Al, and oxide ($O_2$) are co-sputtered at the same time, Al would react with $O_2$ to form $Al_2O_3$ with NiFe particles, thus, resulting in a dielectric layer 920 that is doped with NiFe.

In one instance, the dielectric layer 920 also forms the intermediate layers 250. In another instance, a separate dielectric layer (not shown) that is undoped with magnetic material may be sputtered on top of the dielectric layer 920 to form the intermediate layers 250. In this latter instance, the dielectric layer 920 should preferably be the same or less in thickness as the data layers 240.

Figure 9E:
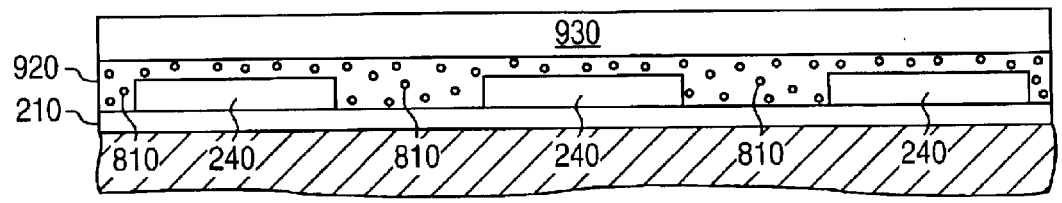
Figure 9F:
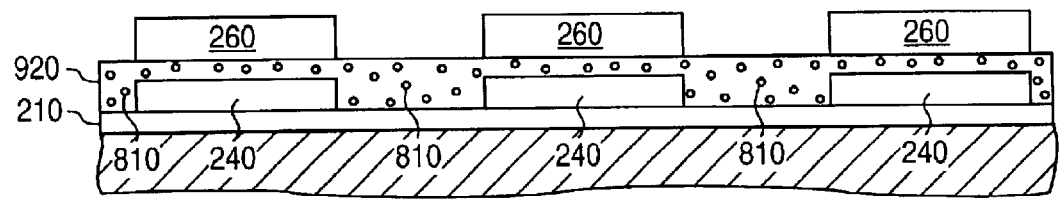
Figure 9G:
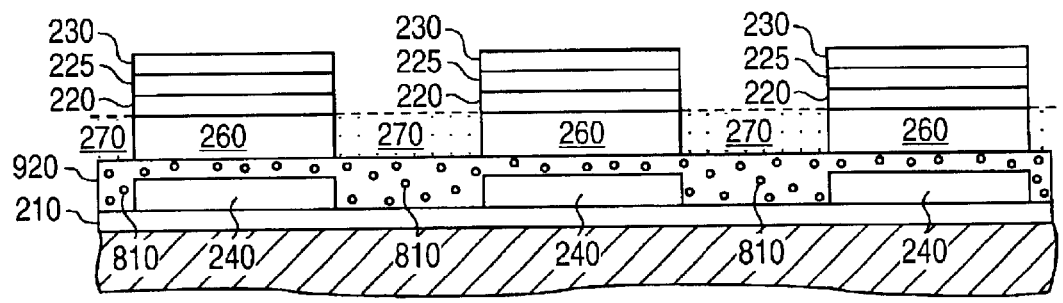

Next, in FIG. 9e, another ferromagnetic layer 930 is formed on top of the dielectric layer 920. The ferromagnetic layer 930 may comprise one or more layers of the same or different material depending on design specifications. In FIG. 9f, the ferromagnetic layer 930 is patterned to form reference layers 260 on top of the data layers 240. Next, in FIG. 9g, insulating material 270 is formed on top of the dielectric layer 920 to prevent exchange coupling between the reference layers 260. In an exemplary implementation, the insulating material 270 may also or alternatively be doped with magnetic materials 810 (not shown). Further, in FIG. 9g, the second conducting layer 220 is formed on top of the reference layer 260. An insulating layer 225 is formed on top of the second conducting layer 220. Lastly, a third conducting layer 230 is formed on top of the insulating layer 225.

VIII. Conclusion

The various embodiments presented herein include exemplary magnetic shield configurations for reducing magnetic interference by substantially absorbing/shielding unwanted fringe magnetic fields using magnetic shielding so that data stored in neighboring magnetic memory cells are not unacceptably corrupted by stray magnetic fields; and also exemplary processes for making such configurations.

Further, the various exemplary embodiments described herein include exemplary magnetic shield configurations for implementation with one type of TMR memory cells. Those skilled in the art will appreciate that the various exemplary magnetic shield configurations may also be implemented with other types of magnetic memory cells known in the art (e.g., other types of TMR memory cells, GMR memory cells, AMR memory cells, CMR memory cells, etc.) in accordance with the requirements of a particular implementation.

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. A method for manufacturing a magnetic shield in a non-volatile memory array, said memory array comprising a plurality of magnetic memory cells, each of said magnetic memory cells including a data layer and a reference layer, wherein a value stored in said data layer is determinable by measuring a relative orientation of the magnetic moments of said data layer and said reference layer, at least one of said magnetic memory cells during operation emanating fringe magnetic fields potentially influencing a nearly magnetic memory cell, said method comprising:

(a) forming a magnetic shielding adjacent to at least one of said magnetic memory cells to reduce magnetic interference with respect to another of said magnetic memory cells; and (b) forming an insulator separating at least a portion of said magnetic shielding from said at least one magnetic memory cell.

2. The method of claim 1 where said (a) includes forming said magnetic shielding in the form of a layer.

3. The method of claim 2 where said magnetic shielding layer is formed above a bit plane of said memory array.

4. The method of claim 2 where said magnetic shielding layer is formed below a bit plane of said memory array.

5. The method of claim 1 where said (a) includes forming said magnetic shielding in the form of patterned magnetic shield materials.

6. The method of claim 5 where a physical configuration of at least one of said patterned magnetic shield materials is selected based at least in part on an amount and direction of magnetic shielding desired.

7. The method of claim 5 where said at least one of said patterned magnetic shield materials includes a strip.

8. The method of claim 5 where said at least one of said patterned magnetic shield materials includes crosses.

9. The method of claim 5 where said at least one of said patterned magnetic shield materials includes bars.

10. The method of claim 5 where said at least one of said patterned magnetic shield materials includes loops.

11. The method of claim 5 where at least some of said patterned magnetic shield materials are formed in a bit plane of said memory array.

12. The method of claim 5 where at least some of said patterned magnetic shield materials are formed in a different plane than a bit plane of said memory array.

13. The method of claim 1 where:
    (1) said magnetic shielding includes a plurality of magnetic particles; and
    (2) said (b) includes:
        (A) forming an insulating oxide between some of said magnetic memory cells; and
        (B) embedding said plurality of magnetic particles in said insulating oxide.

14. A method for manufacturing a magnetic shield in a magnetic memory array, said magnetic memory array comprising a plurality of magnetic memory cells on a substrate, said method comprising:
    (a) forming at least a portion of a magnetic shield layer:
        (1) in a different plane than a bit plane of said memory array; and
        (2) adjacent to at least one of said magnetic memory cells to reduce magnetic interference with respect to another of said magnetic memory cells; and
    (b) forming an insulator separating at least a portion of said magnetic shield layer from said at least one magnetic memory cell.

15. A method for manufacturing a magnetic shield in a magnetic memory array, said memory array comprising a plurality of magnetic memory cells on a substrate, said method comprising:
    (a) forming patterned magnetic shield materials adjacent to at least one of said magnetic memory cells to reduce magnetic interference with respect to another of said magnetic memory cells; and
    (b) forming an insulator separating at least a portion of said patterned magnetic shield materials from said at least one magnetic memory cell.

16. A method for manufacturing a magnetic shield in a magnetic memory array, said memory array comprising a plurality of magnetic memory cells on a substrate, said method comprising:
    (a) forming a plurality of magnetic particles adjacent to at least one of said magnetic memory cells to reduce magnetic interference with respect to another of said magnetic memory cells; and
    (b) forming an insulator separating at least a portion of said plurality of magnetic shield particles from said at least one magnetic memory cell:
        (1) said insulator including an insulating oxide between said magnetic memory cells; and
        (2) said magnetic particles being embedded within said insulating oxide.

* * * * *